United States Patent
Huang et al.

(10) Patent No.: US 9,831,153 B1
(45) Date of Patent: Nov. 28, 2017

(54) HEAT DISSIPATING DEVICE

(71) Applicant: METAL INDUSTRIES RESEARCH & DEVELOPMENT CENTRE, Kaohsiung (TW)

(72) Inventors: Chia-Hung Huang, Kaohsiung (TW); Chih-Peng Wang, Kaohsiung (TW); Sung-Mao Chiu, Kaohsiung (TW); Chun-Chieh Wang, Kaohsiung (TW); Chia-Min Wei, Kaohsiung (TW)

(73) Assignee: Metal Industries Research & Development Centre, Kaohsiung (TW)

( * ) Notice: Subject to any disclaimer, the term of this patent is extended or adjusted under 35 U.S.C. 154(b) by 0 days.

(21) Appl. No.: 15/373,599

(22) Filed: Dec. 9, 2016

(51) Int. Cl.
*H01L 23/40* (2006.01)
*H01L 23/467* (2006.01)
*H01L 23/373* (2006.01)

(52) U.S. Cl.
CPC .......... *H01L 23/40* (2013.01); *H01L 23/3737* (2013.01); *H01L 23/467* (2013.01)

(58) Field of Classification Search
CPC ............. H01L 23/3672; H01L 23/3677; H01L 23/467; H01L 2924/002; H01L 23/3737
USPC ....... 257/71, 712, 713, 7; 361/709, 710, 718
See application file for complete search history.

(56) References Cited

U.S. PATENT DOCUMENTS

| | | | |
|---|---|---|---|
| 7,462,309 B2 * | 12/2008 | Miller | C08K 3/04 264/104 |
| 9,466,597 B2 * | 10/2016 | Liu | H01L 21/4882 |
| 2007/0053168 A1 | 3/2007 | Sayir et al. | |
| 2007/0121299 A1 * | 5/2007 | Campbell | H01L 23/3677 361/710 |
| 2009/0151900 A1 | 6/2009 | Huang | |

FOREIGN PATENT DOCUMENTS

TW    200926945 A    6/2009

* cited by examiner

*Primary Examiner* — Alexander Oscar Williams
(74) *Attorney, Agent, or Firm* — Alan D. Kamrath; Kamrath IP Lawfirm, P.A.

(57) ABSTRACT

A heat dissipating device is provided for reducing the high production costs of conventional heat dissipating devices. The heat dissipating device is mounted on a heat generating object and includes a heat conductive base having a plurality of insertion holes. At least one heat generating region is formed in a contact area between the heat conductive base and a heat source of the heat generating object. A plurality of heat dissipating columns is disposed in the at least one heat generating region and is respectively inserted into and positioned in the plurality of insertion holes. Each heat dissipating column includes a heat conductive silicone layer disposed on an outer periphery thereof.

12 Claims, 10 Drawing Sheets

HEAT DISSIPATING DEVICE

BACKGROUND

1. Technical Field

The present disclosure relates to a heat dissipating device and, more particularly, to a heat dissipating device including heat dissipating columns that can be disposed according to the heat source region.

2. Description of the Related Art

Since electronic elements in electronic products generate heat during operation, many electronic elements include heat sinks disposed therein for carrying away the heat energy generated by the operating electronic products through heat transfer, thereby maintaining stable operation of the electronic products. The heat dissipating structure for ordinary heat sinks generally includes fins or heat dissipating columns. Due to the developing trend of light, thin electronic products with high performance in recent years, the temperature of the operating electronic products increases, and the space for heat dissipation is limited. As a result, the fins or heat dissipating columns on the heat sinks are insufficient for effective heat dissipation, leading to heat accumulation. Consequently, the electronic products cannot provide stable performance, adversely affecting the reliability of the electronic products or even causing shutdown.

FIG. 1 shows a conventional heat dissipating device 9 including a base 91 and a plurality of heat dissipating plates 92. A plurality of heat dissipating columns 911 is disposed on a side of the base 91. Each heat dissipating plate 92 includes a plurality of openings 921 that can be force fitted with the heat dissipating columns 911 to permit the heat dissipating plates 92 to be mounted onto the heat dissipating columns 911 in sequence. Thus, the heat dissipating plates 92 can further increase the heat dissipating area of the heat dissipating device 9 to increase the heat dissipation efficiency. An example of such a heat dissipating device 9 is disclosed in Taiwan Patent No. I411383 entitled "COLUMN-TYPE HEAT SINK WITH HEAT DISSIPATING PLATES".

However, the conventional heat dissipating device 9 must have enough heat dissipating plates 92 to obtain good heat dissipation efficiency, such that the thickness and weight of the whole heat dissipating device 9 cannot be reduced. As a result, the conventional heat dissipating device 9 cannot be used in electronic products of a light, thin design. Furthermore, the heat dissipating columns 911 of the conventional heat dissipating device 9 are integrally formed with the base 91 and are arranged in a matrix, such that the components of the conventional heat dissipating device 9 cannot be adjusted regardless of the heat distribution of the heat sources. Namely, the conventional heat dissipating device 9 provides no substantial help in the area aligned with a region of an electronic product not generating high heat, leading to a waste in the costs for the components.

Thus, improvement to the conventional heat dissipating device is necessary.

SUMMARY

To solve the above problem, the present disclosure provides a heat dissipating device capable of significantly increasing the heat dissipation efficiency of each heat dissipating column, achieving a good heat dissipation effect without using any heat dissipating plates.

The present disclosure provides a heat dissipating device including heat dissipating columns that can be disposed according to the heat source distribution.

A heat dissipating device according to the present disclosure includes is mounted on a heat generating object and includes a heat conductive base having a plurality of insertion holes. At least one heat generating region is formed in a contact area between the heat conductive base and a heat source of the heat generating object. A plurality of heat dissipating columns is disposed in the at least one heat generating region and is respectively inserted into and positioned in the plurality of insertion holes. Each of the plurality of heat dissipating columns includes a heat conductive silicone layer disposed on an outer periphery thereof.

Thus, the heat dissipating device according to the present disclosure includes a silicone layer on the outer periphery of each heat dissipating column to significantly increase the heat dissipation efficiency of each heat dissipating column, thereby achieving a very good heat dissipating effect without using heat dissipating plates. Thus, the whole heat dissipating device can be reduced in the thickness and weight and can be used in electronic products of a light, thin design. Furthermore, the heat dissipating columns of the heat dissipating device according to the present disclosure are detachable and, thus, can be mounted according to the heat source distribution to the locations requiring enhanced heat dissipation. As a result, undesired cost increase resulting from installation of heat dissipating columns in unnecessary locations can be avoid, reducing the production costs and weight of the whole heat dissipating device while increasing the heat dissipation efficiency.

In an example, each of the plurality of insertion holes includes an engagement portion. At least one of two ends of each of the plurality of heat dissipating columns has an assembling portion. The assembling portion of each of the plurality of heat dissipating columns is inserted into one of the plurality of insertion holes and engages with the engagement portion of the one of the plurality of insertion holes. Such a structure increases the positioning stability of the plurality of heat dissipating columns in the heat conductive base.

In an example, the engagement portion of each of the plurality of insertion holes is an inner thread, and each assembling portion is an outer thread formed on the outer periphery of one of the plurality of heat dissipating columns. Such a structure is easy to process, and each heat dissipating column can be rapidly coupled to or disengaged from the heat conductive base, reducing the production costs and increasing the assembling convenience.

In an example, the engagement portion of each of the plurality of insertion holes is one of a magnetic element and a magnetically attracted structure, and each assembling portion is disposed on an end face of one of the plurality of heat dissipating columns and is another of the magnetic element and the magnetically attracted structure. Thus, each heat dissipating column can be rapidly coupled to or disengaged from the heat conductive base, increasing the assembling convenience.

In an example, an entire area of the outer periphery of each of the plurality of heat dissipating columns is enveloped by the heat conductive silicone layer except the assembling portion. This arrangement avoids adverse influence on the engagement stability between the heat dissipating columns and the heat conductive base by the heat conductive silicone layers while assuring the best heat dissipation effect of the heat conductive silicone layers on the heat dissipating columns.

In an example, each of the two ends of each of the plurality of heat dissipating columns has the assembling portion. Thus, each heat dissipating column can serve as a component for connecting two heat conductive bases, increasing utility.

In an example, each of the plurality of insertion holes has a depth smaller than a half of a length of each of the plurality of heat dissipating columns. Thus, a wind passage wind is formed between two connected heat conductive bases, and air can pass through the wind passage to carry away the heat energy absorbed by the heat dissipating columns.

In an example, the heat conductive base includes a first face, a second face opposite to the first face, and a peripheral face connected between the first and second faces. A portion of the plurality of insertion holes is disposed in the first face, and a remaining portion of the plurality of insertion holes is disposed in the peripheral face. Such a structure permits connection of a plurality of heat conductive bases in the vertical or horizontal direction for different demands of different heat dissipating areas.

In an example, each of the remaining portion of the plurality of insertion holes disposed in the peripheral face has a depth larger than or equal to a half of a length of each of the plurality of heat dissipating columns. Thus, the peripheral faces of two adjacent heat conductive bases abut each other. Such a structure is suitable for a heat generating object mounted in a limited space for assembly.

In an example, the heat conductive silicone layer of each of the plurality of heat dissipating columns has a micro structure to increase the overall heat dissipating surface area of the heat conductive silicone layer, further increasing the heat dissipating efficiency.

In an example, wherein the heat conductive silicone layer of each of the plurality of heat dissipating columns further has a graphene layer. The graphene layer effectively increases the heat dissipating efficiency of each heat dissipating column to reduce the total number of the heat dissipating columns, reducing the production costs and weight of the whole heat dissipating device.

In an example, the graphene layer of each of the plurality of heat dissipating columns has a micro structure to increase the overall heat dissipating surface area of the graphene layer, further increasing the heat dissipating efficiency.

The present disclosure will become clearer in light of the following detailed description of illustrative embodiments of this invention described in connection with the drawings.

DETAILED DESCRIPTION

Figure 2:
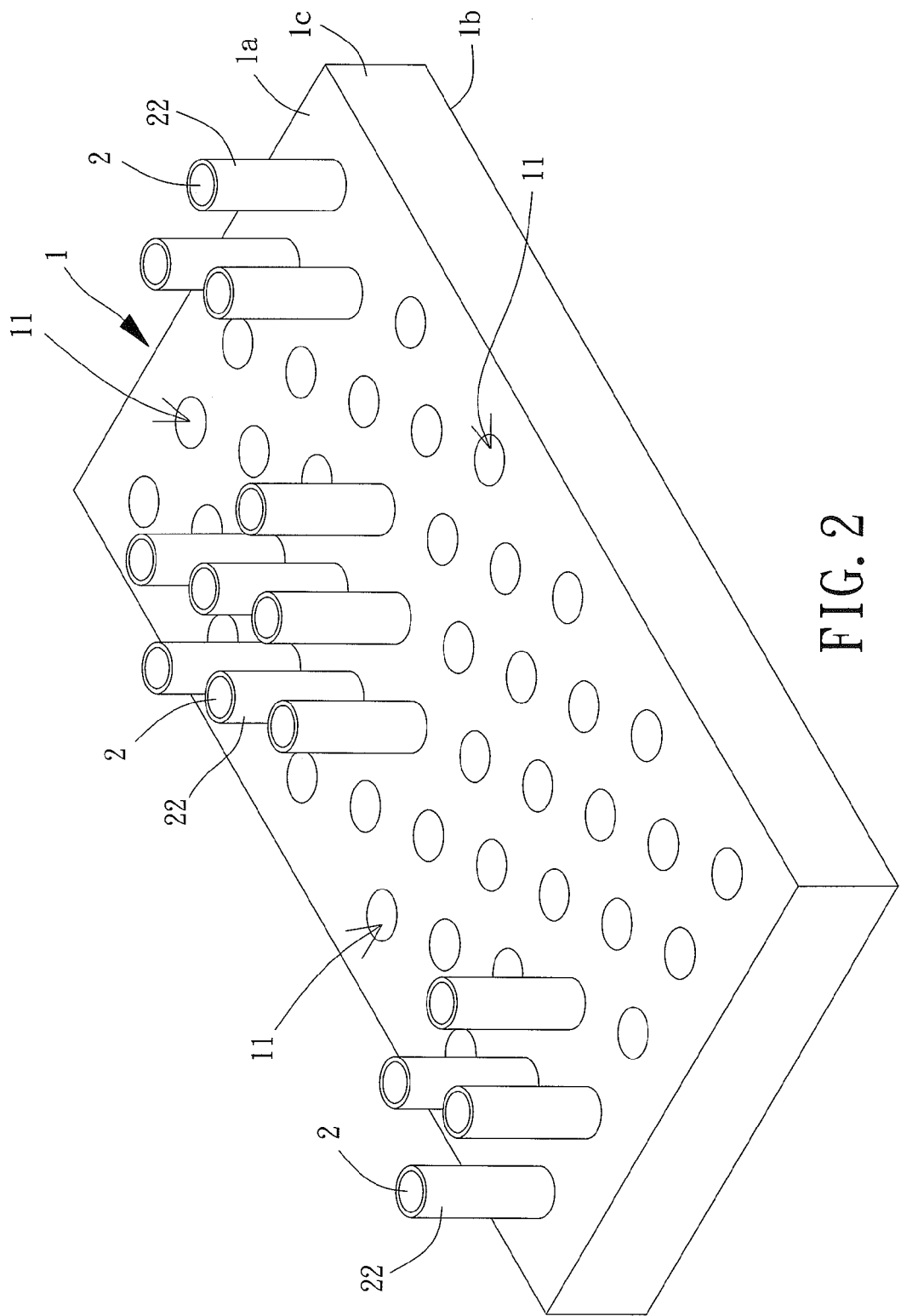
FIG. 2 is a diagrammatic perspective view of a heat dissipating device of a first embodiment according to the present disclosure.

FIG. 2 shows a heat dissipating device of a first embodiment according to the present disclosure. The heat dissipating device generally includes a heat conductive base 1 and a plurality of heat dissipating columns 2 inserted into and positioned in the heat conductive base 1.

Figure 2A:
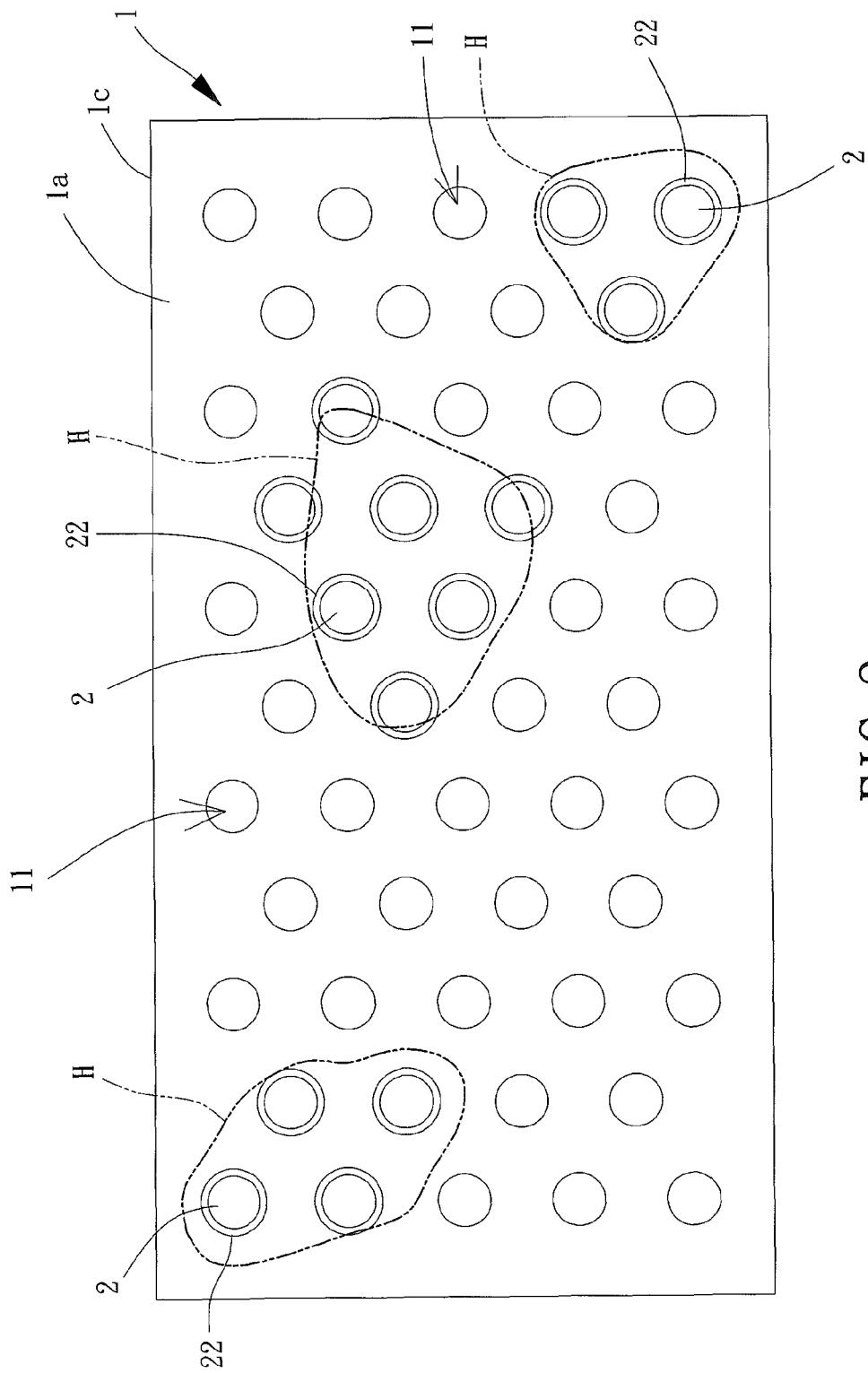
FIG. 2a is a diagrammatic top view of the heat dissipating device of the first embodiment according to the present disclosure.

With reference to FIGS. 2 and 2a, the heat conductive base 1 is made of a material with excellent heat conductivity, such as copper or silicon carbide, for contact with a heat source of a heat generating object (not shown), such that the heat energy at the heat source can be rapidly transmitted to the heat dissipating columns 2. Furthermore, at least one heat generating region H is formed in a contact area between the heat conductive base 1 and the heat source of the heat generating object.

Figure 3:
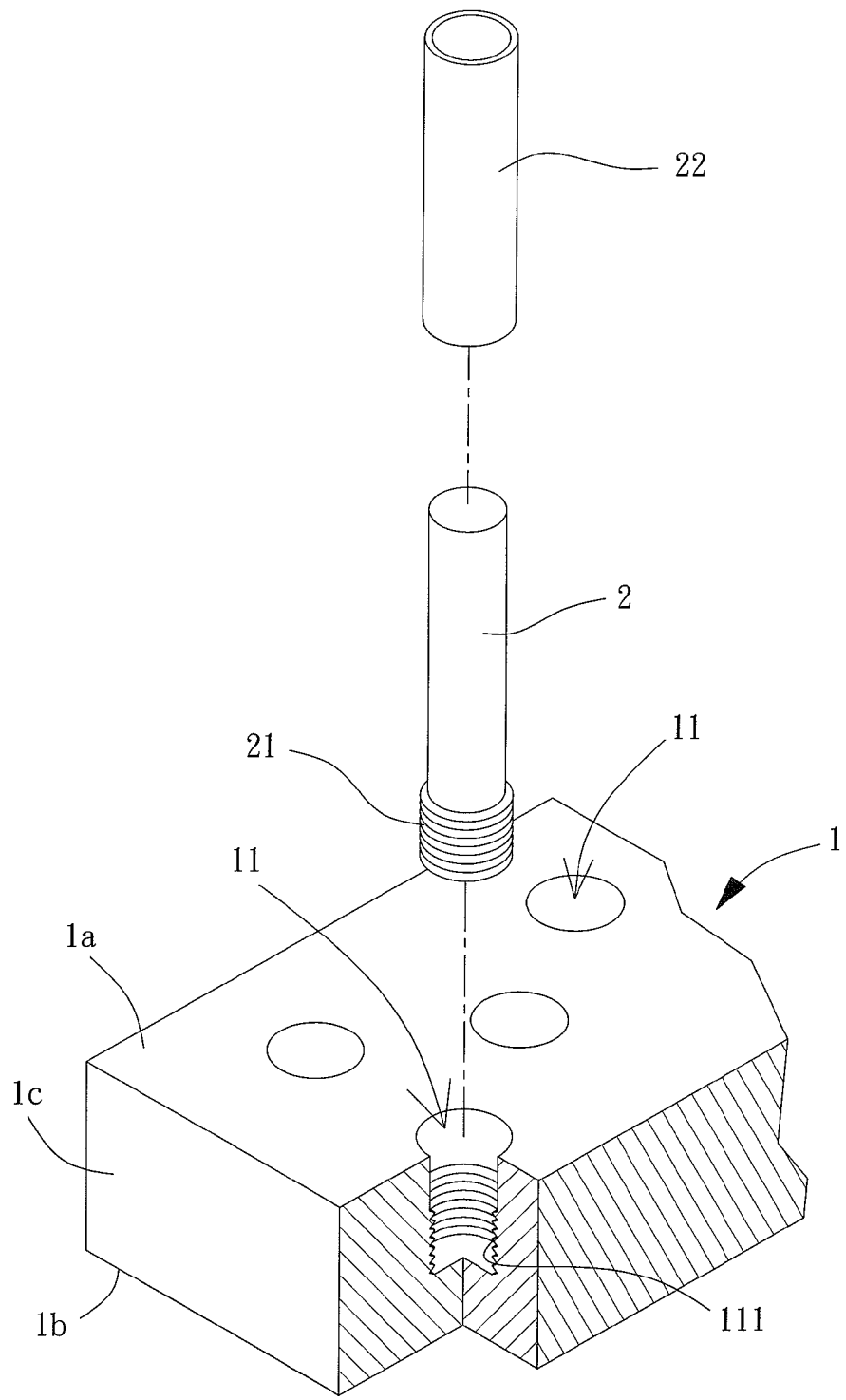
FIG. 3 is a diagrammatic partial, exploded, perspective view of the heat dissipating device of the first embodiment according to the present disclosure.

With reference to FIGS. 2 and 3, the heat conductive base 1 includes a plurality of insertion holes 11. As long as each insertion hole 11 can receive and position a single heat dissipating column 2, the cross sectional area of each insertion hole 11 is not limited. The heat conductive base 1 includes a first face 1a, a second face 1b opposite to the first face 1a, and a peripheral face 1c connected between the first and second faces 1a and 1b. In this embodiment, each insertion hole 11 extends from the first face 1a towards but spaced from the second face 1b, forming a blind hole.

To improve the stability of the heat dissipating columns 2 positioned in the heat conductive base 1, each insertion hole 11 includes an engagement portion 111. At least one of two ends of each heat dissipating column 2 has an assembling portion 21. The assembling portion 21 of each heat dissipating column 2 is inserted into one of the insertion holes 11 and engages with the engagement portion 111 of the insertion hole 11. As a non-restrictive example, the engagement portion 111 of each insertion hole 11 is an inner thread, and the assembling portion 21 is an outer thread formed on an outer periphery of each heat dissipating column 2. In an another example shown in FIG. 7, each engagement portion 111 is a magnetic element (such as a magnet) disposed in one of the insertion holes 11, and each assembling portion 21 is a magnetically attracted structure (such as an iron plate) disposed on an end face of one of the heat dissipating columns 2. Alternatively, each engagement portion 111 is a magnetically attracted structure (such as an iron plate) disposed in one of the insertion holes 11, and each assembling portion 21 is a magnetic element (such as a magnet) disposed on an end face of one of the heat dissipating columns 2. Furthermore, the engagement between each engagement portion 111 and the corresponding assembling portion 21 can be tight fitting, snapping coupling, or other suitable engagement mechanism.

Figure 4:
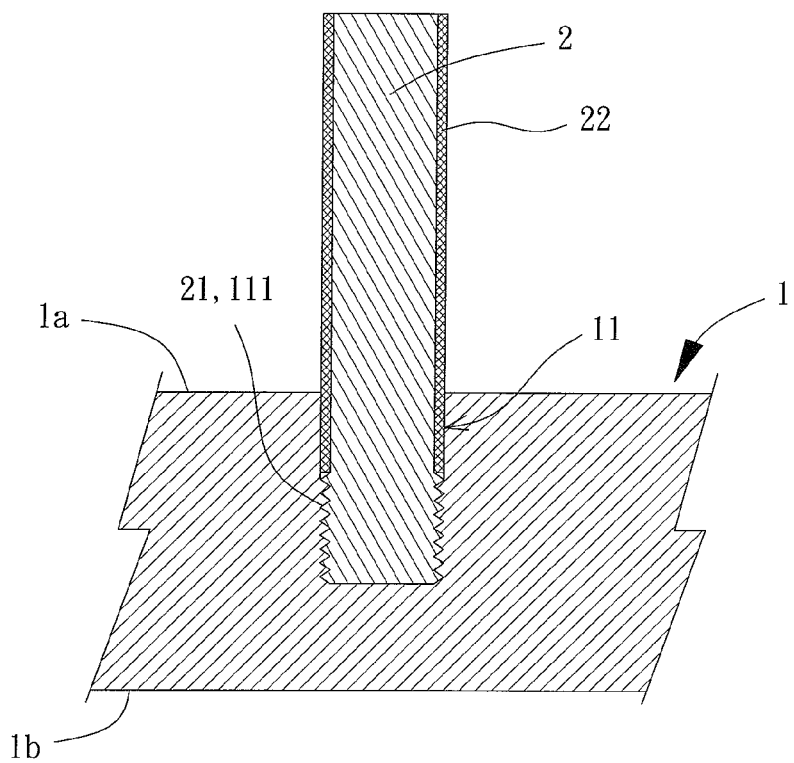
FIG. 4 is a diagrammatic cross sectional view of the heat dissipating device of the first embodiment according to the present disclosure.

With reference to FIGS. 3 and 4, each heat dissipating column 2 includes a heat conductive silicone layer 22 disposed on the outer periphery thereof to significantly increase the heat dissipation efficiency of each heat dissipating column 2. Thus, a good heat dissipation effect can be achieved without heat dissipating plates. The heat conductive silicone is adhesive after heating, such that the heat conductive silicone layer 22 can be securely bonded on the outer periphery of each heat dissipating column 2 without the need of applying an adhesive agent on the outer periphery of each heat dissipating column 2. Furthermore, the entire area of the outer periphery of each heat dissipating column 2 is enveloped by the heat conductive silicone layer 22 except the assembling portion 21, avoiding adverse influence on the engagement stability between the heat dissipating columns 2 and the heat conductive base 1 by the heat conductive silicone layers 22 while assuring the best heat dissipation effect of the heat conductive silicone layers 22 on the heat dissipating columns 2. In another embodiment, each heat conductive silicone layer 22 can be wound around one of the heat dissipating columns 2 like a tape.

Figure 1:
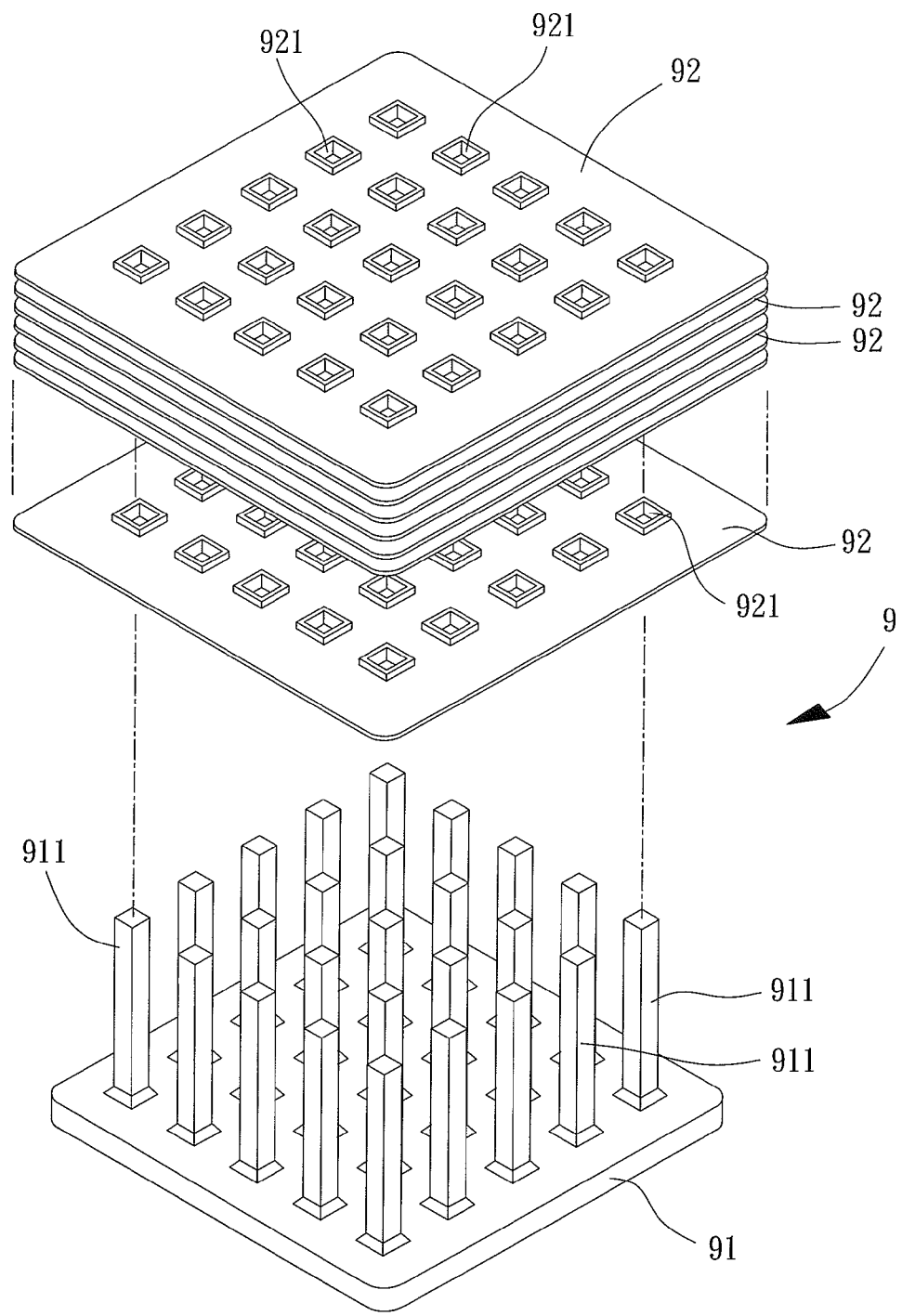
FIG. 1 is a diagrammatic exploded, perspective view of a conventional heat dissipating device.

It is noted that redundant heat conductive silicone is regarded as a waste during processing of light emitting diodes (LEDs). According to the present disclosure, the heat conductive silicone can be recycled and can be disposed on the outer periphery of each heat dissipating column 2 to significantly increase the heat dissipation efficiency of each heat dissipating column 2. Recycling and use of the waste material meet the concept of environmental protection. Furthermore, in comparison with mounting heat dissipating plates 92 onto the heat dissipating columns 911 in the prior art (see FIG. 1) to increase the heat dissipation efficiency, the manufacturing costs of the heat dissipating columns 2 according to the present disclosure can be greatly reduced.

Please refer to FIGS. 2 and 2a again. A plurality of identical heat conductive bases 1 can be prepared according to the present disclosure, and each heat conductive base 1 includes many insertion holes 11 for various heat dissipating demands. Namely, in use, a desired amount of heat dissipating columns 2 can be selected according to the heat source distribution on the heat generating object to be used this time. These heat dissipating columns 2 are inserted into an area of the heat conductive base 1 corresponding to the at least one heat generating region H. Furthermore, the number or position of these heat dissipating columns 2 can be changed at any time. Thus, the assembling efficiency and use convenience can be increased while reducing the weight of the heat conductive base 1. Alternatively, the heat conductive base 1 can be custom made according to the heat source distribution to accurately select the position and number of the insertion holes 11. Thus, the heat dissipating columns 2 are exactly aligned with the high heat location after assembly to effectively provide a good heat dissipation effect while avoiding a waste in the costs for forming the insertion holes 11 and the heat dissipating columns 2.

Thus, the heat dissipating device according to the present disclosure uses the heat conductive base 1 and the heat dissipating columns 2 separate from the heat conductive base 1 and detachably mounted to the heat conductive base 1 for meeting different heat dissipating demands. The heat dissipating columns 2 are accurately located in the locations requiring enhanced heat dissipation, avoiding undesired costs resulting from installation of the heat dissipating columns 2 in unnecessary locations. As a result, the production costs and weight of the whole heat dissipating device can be reduced while increasing the heat dissipation efficiency.

Figure 5:
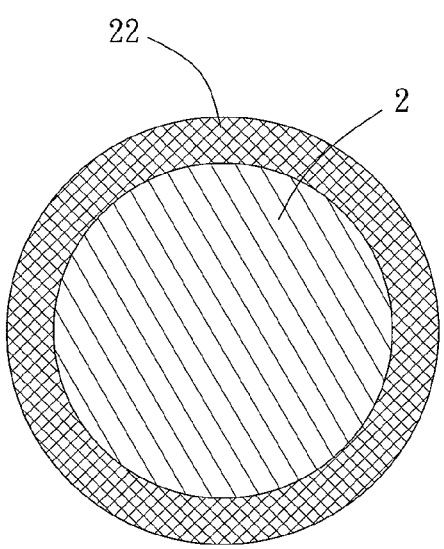
FIG. 5 is a diagrammatic cross sectional view of an example of a heat dissipating column of the heat dissipating device of the first embodiment according to the present disclosure.
Figure 6:
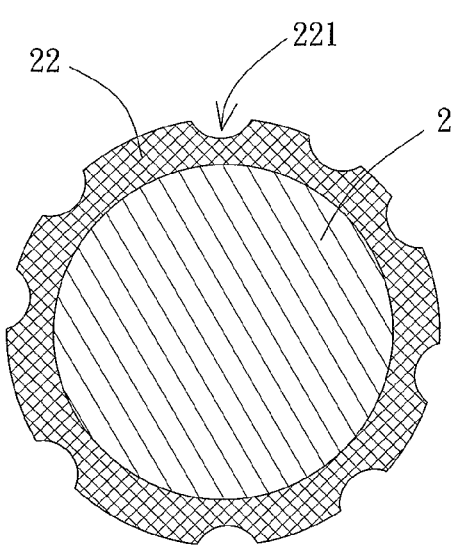
FIG. 6 is a diagrammatic cross sectional view of another example of the heat dissipating column of the heat dissipating device of the first embodiment according to the present disclosure, with the heat dissipating column including a heat conductive silicone layer having a micro structure.

With reference to FIGS. 4 and 5, the outer periphery of the heat conductive silicone layer 22 of each heat dissipating column 2 can be smooth. In another example shown in FIG. 6, the outer periphery of the heat conductive silicone layer 22 of each heat dissipating column 2 can be processed by laser or other processing to generate a micro structure 221 on the heat conductive silicone layer 22 for the purposes of increasing the surface area of the outer periphery of the heat conductive silicone layer 22 to increase the overall heat dissipating surface area of the heat conductive silicone layer 22, thereby further increasing the heat dissipation efficiency.

Figure 7:
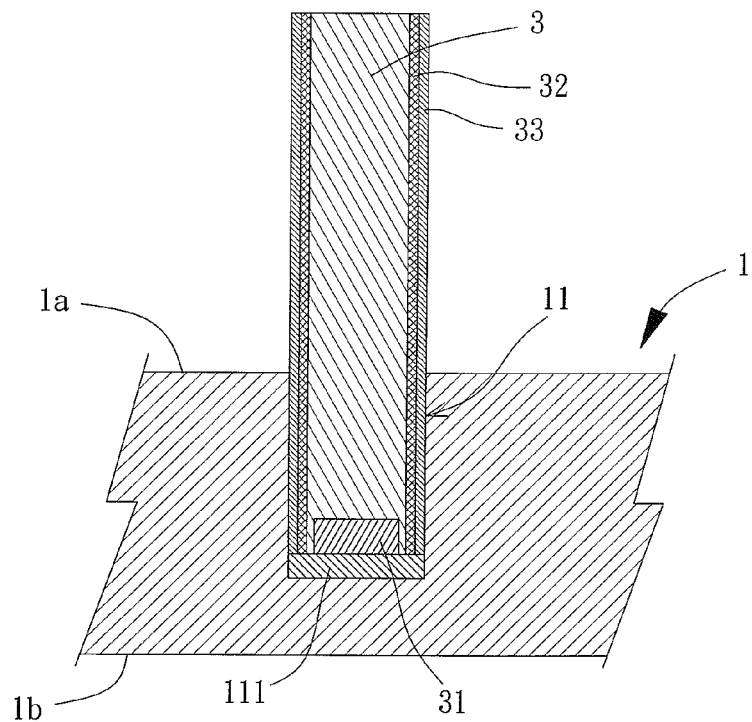
FIG. 7 is a diagrammatic cross sectional view of a heat dissipating device of a second embodiment according to the present disclosure.

FIG. 7 shows a heat dissipating device of a second embodiment according to the present disclosure which is substantially the same as the first embodiment. The main difference between the two embodiments is that each heat dissipating column 3 of the second embodiment according to the present disclosure has a graphene layer 33.

Specifically, each heat dissipating column 3 includes an assembling portion 31 on at least one end thereof. The assembling portions 31 are inserted into the corresponding insertion holes 11 of the heat conductive base 1 according to the at least one heat generating region H on the heat conductive base 1 and engage with the engagement portions 111 of the corresponding insertion holes 11. Each heat conductive silicone layer 32 also includes a heat conductive silicone layer 32 on an outer periphery thereof, and the heat conductive silicone layer 32 further includes the above-mentioned graphene layer 33 to effectively increase the heat dissipation efficiency of each heat dissipating column 3. Thus, the heat dissipating device of this embodiment uses fewer heat dissipating columns 3 to achieve the same heat dissipation efficiency as the first embodiment. Furthermore, the production costs and weight of the whole heat dissipating device can be reduced by reducing the total number of the heat dissipating columns 3. As a non-restrictive example, graphene is applied to an outer surface of the heat conductive silicone layer 32 of each heat dissipating column 3 to form the graphene layer 33.

Figure 8:
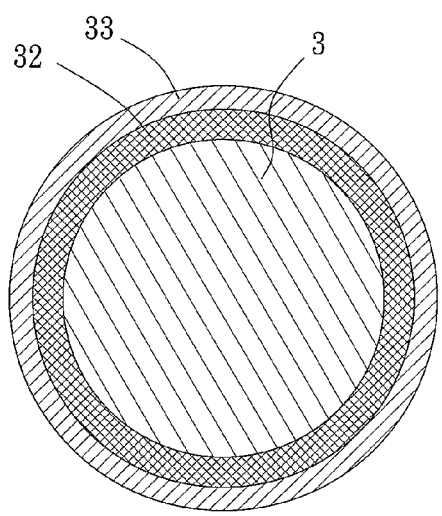
FIG. 8 is a diagrammatic cross sectional view of an example of a heat dissipating column of the heat dissipating device of the second embodiment according to the present disclosure.
Figure 9:
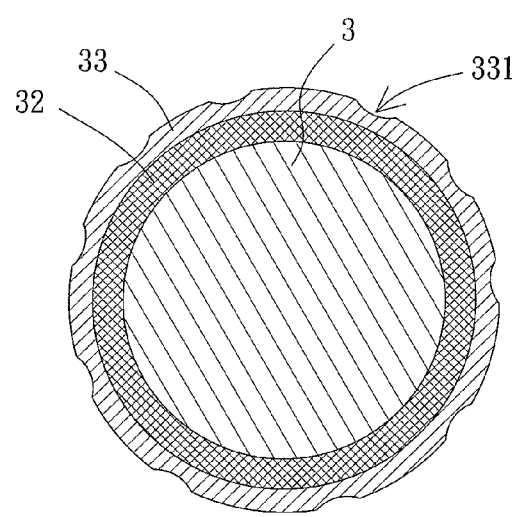
FIG. 9 is a diagrammatic cross sectional view of another example of the heat dissipating column of the heat dissipating device of the second embodiment according to the present disclosure, with the heat dissipating column including a graphene layer having a micro structure.

With reference to FIG. 8, the outer periphery of the outermost graphene layer 33 of each heat dissipating column 3 can be smooth. In another example shown in FIG. 9, the outer periphery of the outermost graphene layer 33 of each heat dissipating column 3 can be processed by laser or other processing to generate a micro structure 331 on the graphene layer 33 for the purposes of increasing the surface area of the outer periphery of the graphene layer 33 to increase the overall heat dissipating surface area of the graphene layer 33, thereby further increasing the heat dissipation efficiency.

Figure 10:
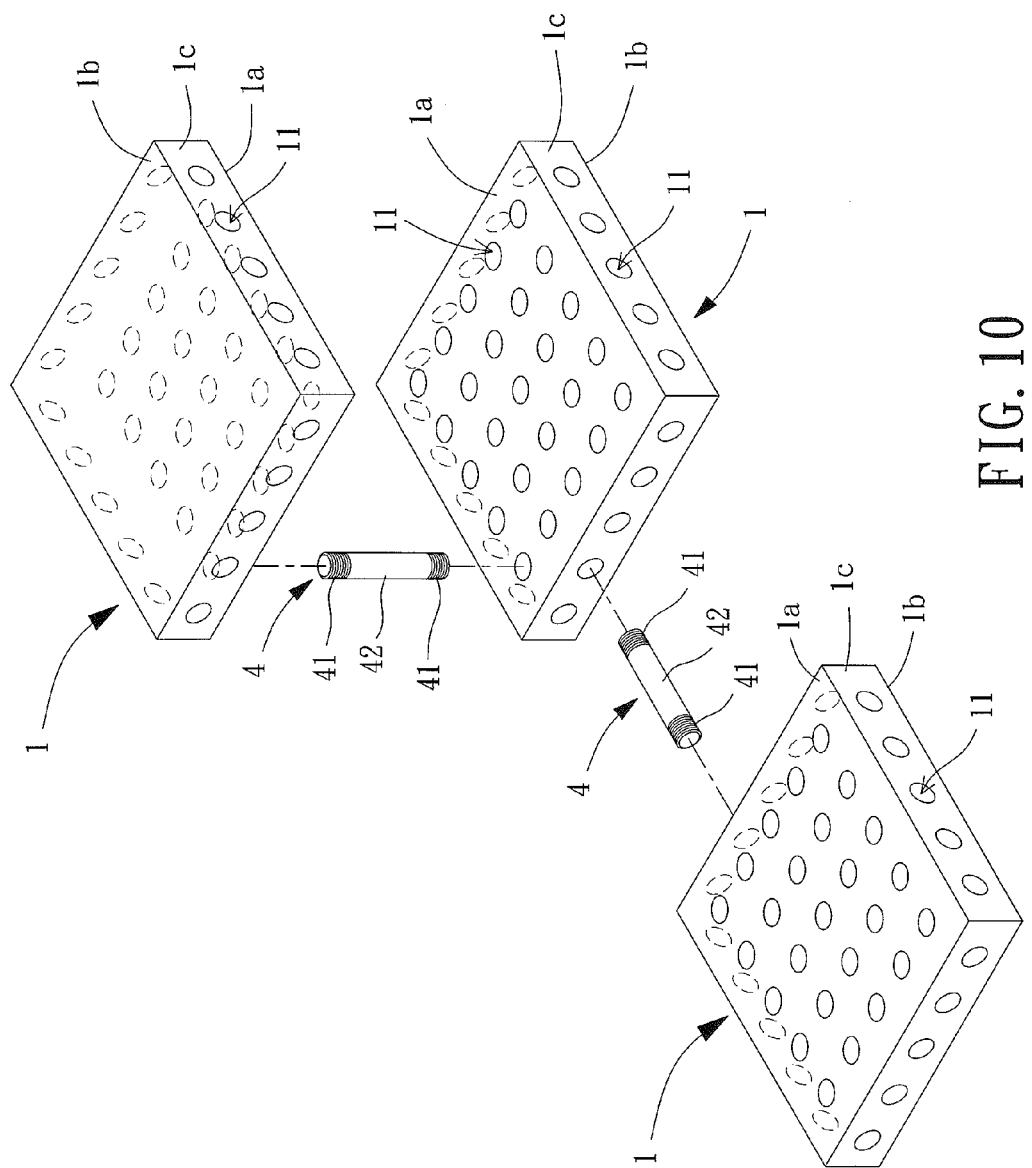
FIG. 10 is a diagrammatic exploded, perspective view illustrating coupling of a heat dissipating device of a third embodiment according to the present disclosure by long heat dissipating columns.

FIG. 10 shows a heat dissipating device of a third embodiment according to the present disclosure which is substantially the same as the first embodiment. The main difference between the two embodiments is that the third embodiment includes an assembling portion 41 on each of two ends of each heat dissipating column 4, such that the heat dissipating columns 4 can serve as components for connecting two heat conductive bases 1.

Specifically, in this embodiment, each heat conductive base 1 is regarded as a unit, and the heat conductive bases 1 are connected in a vertical or horizontal direction to provide a heat dissipating device having the desired heat dissipating surface area. Namely, in this embodiment, in addition to the insertion holes 11 in the first face 1a, each heat conductive base 1 further includes insertion holes 11 in the peripheral face 1c, and each insertion hole 11 in the peripheral face 1c has an engagement portion 111 for engaging with the assembling portion 41 of one of two ends of a heat dissipating column 4.

In a case that the depth of each insertion hole 11 is smaller than a half of an axial length of each heat dissipating column 4, when it is desired to connect two heat conductive bases 1 in the vertical direction, the first faces 1a of the two heat conductive bases 1 face each other, and the assembling portions 41 on two ends of each of a plurality of heat dissipating columns 4 are inserted into corresponding insertion holes 11 and engage with corresponding engagement portions 111. Thus, the heat dissipating columns 4 together support the two heat conductive bases 1, and the first faces 1a of the two vertically connected heat conductive bases 1 are spaced from each other to form a wind passage through which air passes to carry away the heat energy absorbed by the heat dissipating columns 4.

Figure 11:
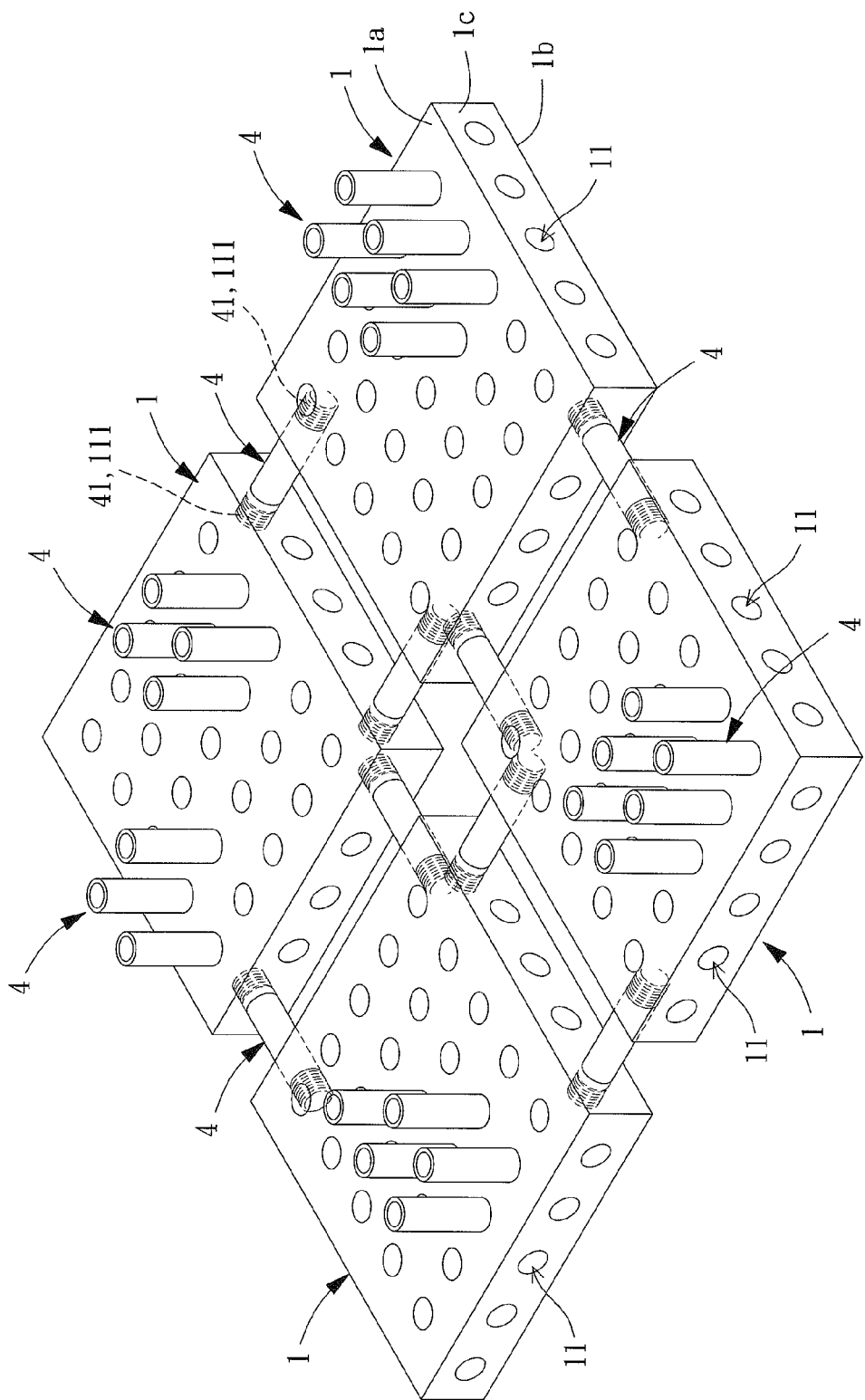
FIG. 11 is a diagrammatic perspective view illustrating coupling of the heat dissipating device of the third embodiment according to the present disclosure by long heat dissipating columns.

With reference to FIG. 11, when it is desired to connect two or more heat conductive bases 1 in the horizontal direction, the peripheral faces 1c of two adjacent heat conductive bases 1 face each other, and the assembling portions 41 on two ends of each of a plurality of heat dissipating columns 4 are inserted into corresponding insertion holes 11 and engage with corresponding engagement portions 111 to form a larger heat dissipating device. Since the depth of each insertion hole 11 is smaller than a half of the axial length of each heat dissipating column 4, a wind passage is defined between the peripheral faces 1c of the horizontally connected two or more heat conductive bases 1. Thus, air can flow between two adjacent heat conductive bases 1 to carry away the heat energy absorbed by the heat dissipating columns 4. A suitable number of heat dissipating columns 4 can be inserted into some of the insertion holes 11 in the first face 1a of each heat conductive base 1 according to the heat source distribution of the heat generating object to be used this time, and each of the heat dissipating columns 4 is aligned with the heat generating region H of the corresponding heat conductive base 1 for rapidly dissipating the heat at the high heat region of the heat generating object. The assembling portion 41 can be provided on one or both of two ends of each heat dissipating column 4 disposed on the first face 1a of the corresponding heat conductive base 1. The present disclosure is not limited in this regard.

Figure 12:
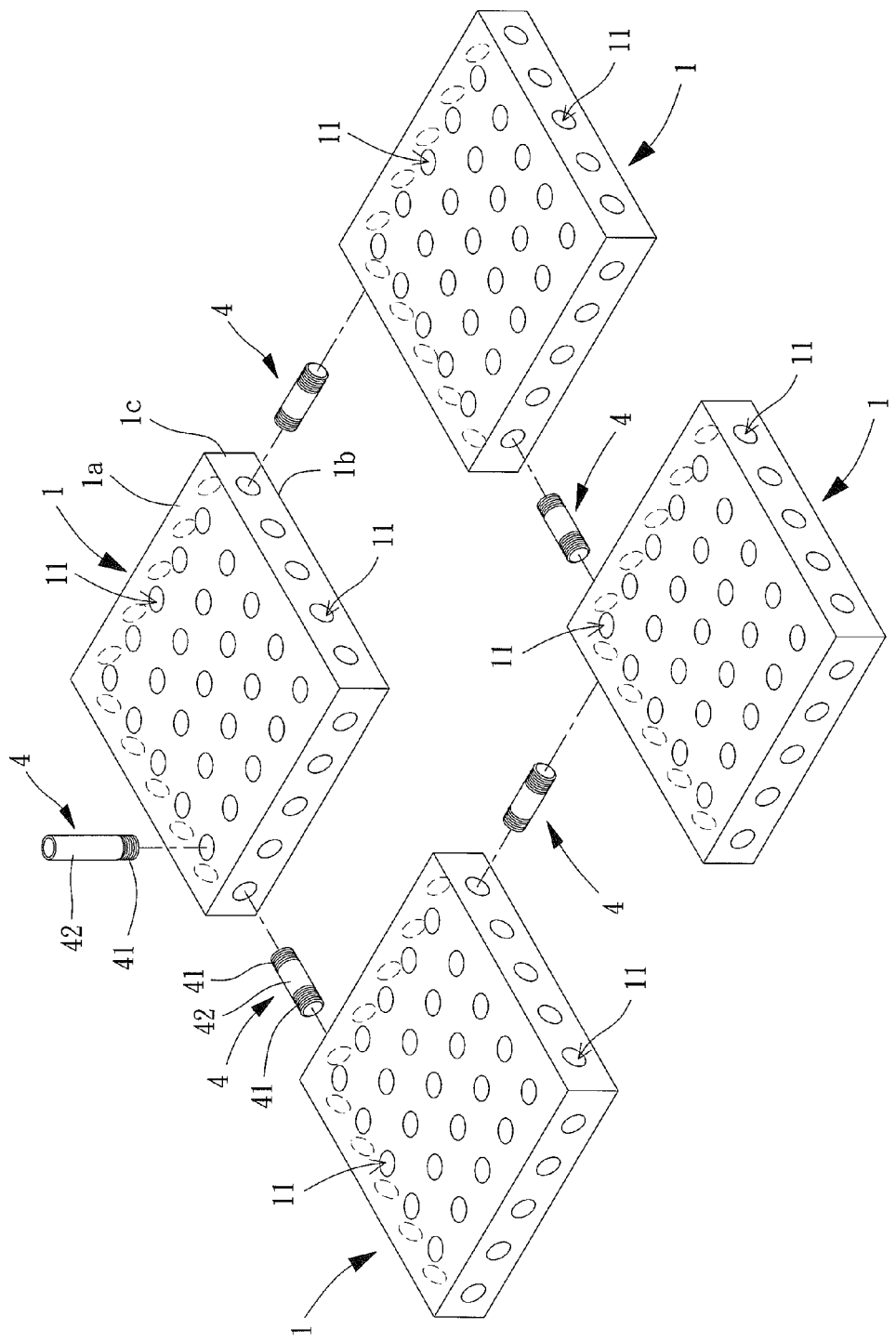
FIG. 12 is a diagrammatic exploded, perspective view illustrating coupling of the heat dissipating device of the third embodiment according to the present disclosure by short heat dissipating columns.
Figure 13:
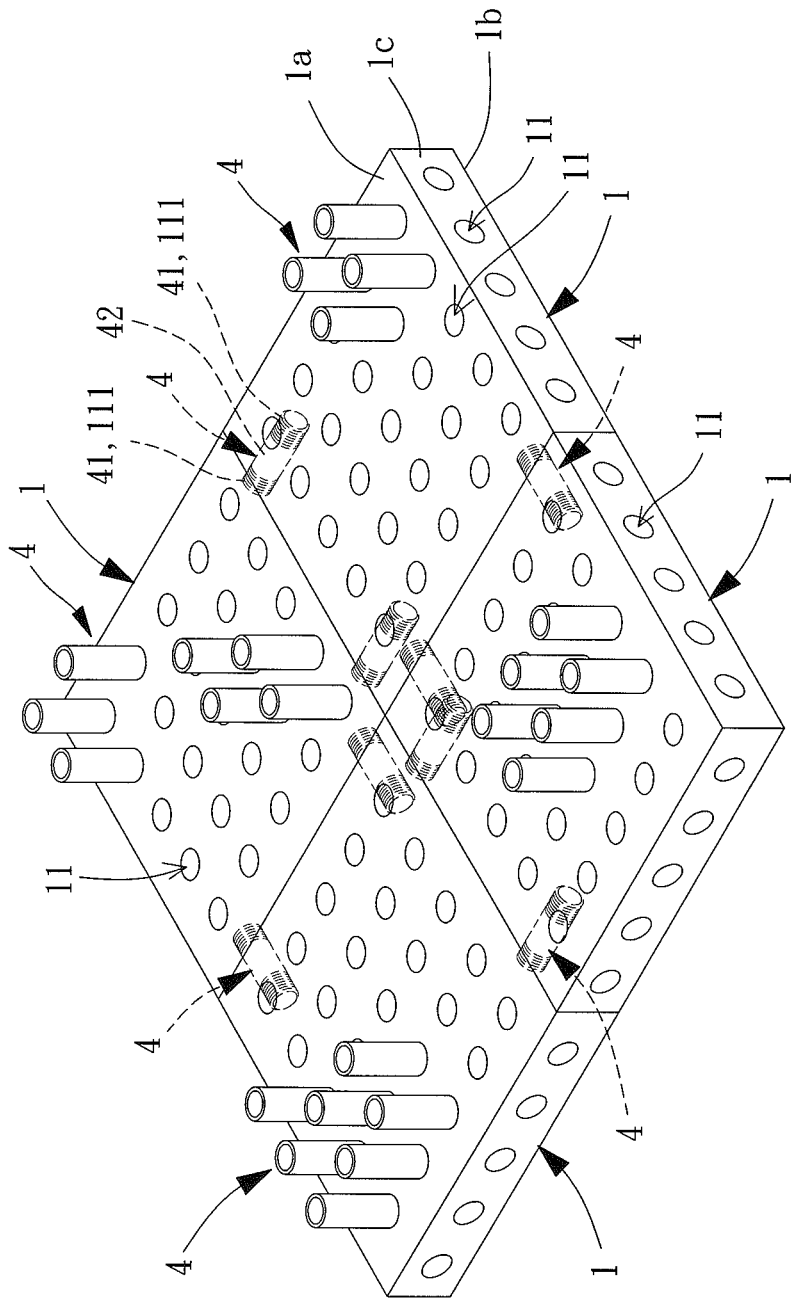
FIG. 13 is a diagrammatic perspective view illustrating coupling of the heat dissipating device of the third embodiment according to the present disclosure by short heat dissipating columns.

With reference to FIGS. 12 and 13, in a case that the depth of each insertion hole 11 is larger than or equal to a half of the axial length of each heat dissipating column 4, when it is desired to connect two or more heat conductive bases 1 in the horizontal direction, each heat dissipating column 4 for connecting two adjacent heat conductive bases 1 can be completely received in two aligned insertion holes 11, such that the peripheral faces 1c of the two adjacent heat conductive bases 1 abut each other. This embodiment is suitable for a heat generating object mounted in a limited space for assembly.

In the embodiments shown in FIGS. 10-13, the outer periphery of each heat dissipating column 4 includes at least a heat conductive silicone layer 42, and the heat conductive silicone layer 42 can also include a graphene layer (not shown). Thus, the heat dissipating columns 4 of the third embodiment according to the present disclosure has good heat dissipation efficiency.

In view of the foregoing, the heat dissipating device according to the present disclosure includes a silicone layer on the outer periphery of each heat dissipating column to significantly increase the heat dissipation efficiency of each heat dissipating column, thereby achieving a very good heat dissipating effect without using heat dissipating plates. Thus, the whole heat dissipating device can be reduced in the thickness and weight and can be used in electronic products of a light, thin design. Furthermore, the heat dissipating columns of the heat dissipating device according to the present disclosure are detachable and, thus, can be mounted according to the heat source distribution to the locations requiring enhanced heat dissipation. As a result, undesired cost increase resulting from installation of heat dissipating columns in unnecessary locations can be avoid, reducing the production costs and weight of the whole heat dissipating device while increasing the heat dissipation efficiency.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

What is claimed is:

1. A heat dissipating device adapted to be mounted on a heat generating object, with the heat dissipating device comprising:
    a heat conductive base including a plurality of insertion holes, with at least one heat generating region formed in a contact area between the heat conductive base and a heat source of the heat generating object; and
    a plurality of heat dissipating columns disposed in the at least one heat generating region and respectively inserted into and positioned in the plurality of insertion holes, with each of the plurality of heat dissipating columns including a heat conductive silicone layer disposed on an outer periphery thereof.

2. The heat dissipating device as claimed in claim 1, with each of the plurality of insertion holes including an engagement portion, with at least one of two ends of each of the plurality of heat dissipating columns having an assembling portion, with the assembling portion of each of the plurality of heat dissipating columns inserted into one of the plurality of insertion holes and engaged with the engagement portion of the one of the plurality of insertion holes.

3. The heat dissipating device as claimed in claim 2, wherein the engagement portion of each of the plurality of insertion holes is an inner thread, and each assembling portion is an outer thread formed on the outer periphery of one of the plurality of heat dissipating columns.

4. The heat dissipating device as claimed in claim 2, wherein the engagement portion of each of the plurality of insertion holes is one of a magnetic element and a magnetically attracted structure, and each assembling portion is disposed on an end face of one of the plurality of heat dissipating columns and is another of the magnetic element and the magnetically attracted structure.

5. The heat dissipating device as claimed in claim 2, wherein an entire area of the outer periphery of each of the plurality of heat dissipating columns is enveloped by the heat conductive silicone layer except the assembling portion.

6. The heat dissipating device as claimed in claim 2, wherein each of the two ends of each of the plurality of heat dissipating columns has the assembling portion.

7. The heat dissipating device as claimed in claim 6, wherein each of the plurality of insertion holes has a depth smaller than a half of a length of each of the plurality of heat dissipating columns.

8. The heat dissipating device as claimed in claim 6, with the heat conductive base including a first face, a second face opposite to the first face, and a peripheral face connected between the first and second faces, with a portion of the plurality of insertion holes disposed in the first face, and a remaining portion of the plurality of insertion holes disposed in the peripheral face.

9. The heat dissipating device as claimed in claim 8, wherein each of the remaining portion of the plurality of insertion holes disposed in the peripheral face has a depth larger than or equal to a half of a length of each of the plurality of heat dissipating columns.

10. The heat dissipating device as claimed in claim 1, wherein the heat conductive silicone layer of each of the plurality of heat dissipating columns has a micro structure.

11. The heat dissipating device as claimed in claim 1, wherein the heat conductive silicone layer of each of the plurality of heat dissipating columns further has a graphene layer.

12. The heat dissipating device as claimed in claim 11, wherein the graphene layer of each of the plurality of heat dissipating columns has a micro structure.

* * * * *